(12) United States Patent
Kitani

(10) Patent No.: US 9,621,830 B2
(45) Date of Patent: Apr. 11, 2017

(54) IMAGE SENSOR, IMAGE CAPTURING APPARATUS, AND CELLULAR PHONE

(71) Applicant: CANON KABUSHIKI KAISHA, Tokyo (JP)

(72) Inventor: Kazunari Kitani, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/550,205

(22) Filed: Nov. 21, 2014

(65) Prior Publication Data

US 2016/0156861 A1    Jun. 2, 2016

(30) Foreign Application Priority Data

Nov. 25, 2013  (JP) ................................ 2013-243346
Oct. 24, 2014  (JP) ................................ 2014-217663

(51) Int. Cl.
*H04N 5/374*    (2011.01)
*H01L 27/146*   (2006.01)
*H04N 5/3745*   (2011.01)
*H04N 5/378*    (2011.01)
*H04N 5/376*    (2011.01)

(52) U.S. Cl.
CPC ......... *H04N 5/374* (2013.01); *H01L 27/1464* (2013.01); *H01L 27/14634* (2013.01); *H01L 27/14636* (2013.01); *H04N 5/376* (2013.01); *H04N 5/378* (2013.01); *H04N 5/3742* (2013.01); *H04N 5/37455* (2013.01)

(58) Field of Classification Search
CPC ... H04N 5/374–5/378; H01L 27/14638; H01L 27/14634; H01L 27/14636
See application file for complete search history.

(56) References Cited

U.S. PATENT DOCUMENTS

| | | | | |
|---|---|---|---|---|
| 2012/0105696 A1* | 5/2012 | Maeda | ............... | H01L 21/76898 348/302 |
| 2012/0120293 A1* | 5/2012 | Mabuchi | ............ | H01L 27/14632 348/302 |
| 2012/0307030 A1* | 12/2012 | Blanquart | ......... | H01L 27/14601 348/76 |
| 2013/0293753 A1* | 11/2013 | Keelan | ................. | H04N 5/3745 348/302 |
| 2015/0163403 A1* | 6/2015 | Wakabayashi | ......... | H04N 5/378 348/308 |

FOREIGN PATENT DOCUMENTS

| | | |
|---|---|---|
| JP | 05-048460 A | 2/1993 |
| JP | 2011-159958 A | 8/2011 |
| KR | 10-2012-0044246 A | 5/2012 |

* cited by examiner

*Primary Examiner* — Paul Berardesca
(74) *Attorney, Agent, or Firm* — Cowan, Liebowitz & Latman, P.C.

(57) ABSTRACT

An image sensor comprises: a first semiconductor including a plurality of pixels two-dimensionally arranged, and a plurality of divided output lines, in a first direction, configured to read out pixel signals from the plurality of pixels in the first direction; and a second semiconductor including a plurality of signal processing units, corresponding to the plurality of output lines, respectively, configured to process the readout pixel signals, and a readout unit configured to read out the signals output from the signal processing units in a second direction, wherein the first semiconductor and the second semiconductor are stacked, and the plurality of output lines and the plurality of signal processing units are connected in correspondence with each other.

16 Claims, 6 Drawing Sheets

IMAGE SENSOR, IMAGE CAPTURING APPARATUS, AND CELLULAR PHONE

BACKGROUND OF THE INVENTION

Field of the Invention

The present invention relates to an image sensor, and an image capturing apparatus and cellular phone that use the image sensor.

Description of the Related Art

Conventionally, a CMOS image sensor has been widely adopted for an image capturing apparatus such as a digital camera and digital video camera. The image sensor includes a pixel area, and its peripheral circuits for outputting, amplifying, and reading out signals from the pixel area.

In recent years, along with miniaturization of pixels, it has been considered how to ensure the area of a photodiode. By reducing the number of elements constituting each pixel, it is possible to ensure the area of a photodiode, and also ensure a large number of pixels and image quality.

On the other hand, if only the number of pixels is increased, the readout speed decreases. Therefore, to implement a high-speed readout operation, for example, a plurality of horizontal output lines and a plurality of output amplifiers are prepared to provide multiple output channels. Furthermore, a so-called column A/D type image sensor (see, for example, Japanese Patent Laid-Open No. 05-048460) that integrates an A/D conversion function for each column is introduced to increase the speed of a system including A/D conversion.

Some column A/D type image sensors are formed by a so-called stacked structure in which A/D conversion units for respective columns are formed in two chips and these chips are connected as described in, for example, Japanese Patent Laid-Open No. 2011-159958.

If A/D converters are added as peripheral circuits as described in Japanese Patent Laid-Open No. 05-048460, however, the area of the peripheral circuits unwantedly becomes relatively large as the functions of the peripheral circuits increase.

For example, if the area occupied by the image sensor is predetermined like the 35-mm full size format for a single-lens reflex digital camera, as the peripheral circuit area increases, the chip size simply increases. A package to store the chip also becomes large, as a matter of course.

Especially when incorporating an image sensor in a single-lens reflex camera, if the size in the vertical direction of the image sensor (the size in the vertical direction of the camera) increases, the image sensor interferes with the light path of the optical viewfinder of the single-lens reflex camera. If an attempt is made to move the light path upward to prevent such interference, it becomes necessary to largely change a viewfinder optical system. This requires the conventional mechanical structure of the single-lens reflex camera to be largely modified, and thus the load of mechanical design increases. Even if modification is implemented, a large viewfinder prism and the like become necessary, thereby increasing the cost of the mechanical structural parts and optical parts.

On the other hand, even if the stacked structure is adopted as described in Japanese Patent Laid-Open No. 2011-159958, the projection area can be reduced as compared with a case in which the image sensor is formed by a single chip but the readout time will never be shorten by adopting the stacked structure.

In Japanese Patent Laid-Open No. 2011-159958, since an image processing block is mounted, the second chip can be effectively used. In fact, however, in a single-lens reflex digital camera using a large-capacity memory, it is necessary to arrange a memory chip near the image processing block, and thus it is not always desirable to arrange the image processing block on the second chip. If the image signal processing block is not arranged on the second chip, the number of circuits actually arranged on the second chip is very small with respect to the chip area, resulting in a very expensive stacked chip.

SUMMARY OF THE INVENTION

The present invention has been made in consideration of the above situation, and achieves a high quality image and a high-speed readout operation without excessively increasing the area and cost of an image sensor.

According to the present invention, provided is an image sensor comprising: a first semiconductor including a plurality of pixels two-dimensionally arranged, and a plurality of divided output lines, in a first direction, configured to read out pixel signals from the plurality of pixels in the first direction; and a second semiconductor including a plurality of signal processing units, corresponding to the plurality of output lines, respectively, configured to process the readout pixel signals, and a readout unit configured to read out the signals output from the signal processing units in a second direction, wherein the first semiconductor and the second semiconductor are stacked, and the plurality of output lines and the plurality of signal processing units are connected in correspondence with each other.

Further, according to the present invention, provided is an image capturing apparatus comprising the image sensor defined as above.

Furthermore, according to the present invention, provided is a cellular phone comprising the image sensor defined as above.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings. The dimensions, shapes and relative positions of the constituent parts shown in the embodiments should be changed as convenient depending on various conditions and on the structure of the apparatus adapted to the invention, and the invention is not limited to the embodiments described herein.

First Embodiment

Figure 1:
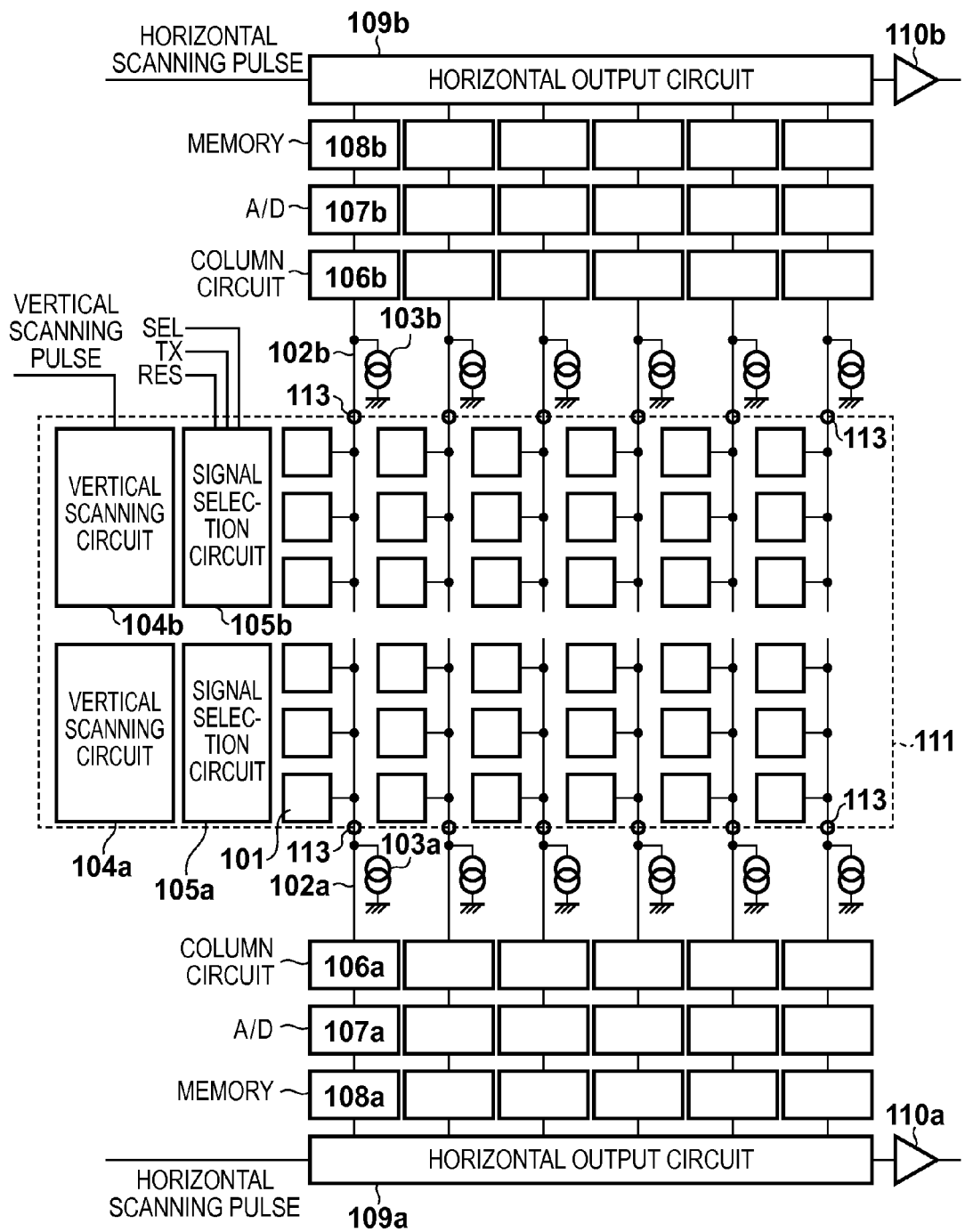
FIG. 1 is a diagram showing a schematic arrangement of an image sensor according to a first embodiment of the present invention.

The first embodiment of the present invention will be described with reference to FIG. 1. FIG. 1 describes the schematic arrangement of an image sensor according to the first embodiment of the present invention. Note that the image sensor of the present invention can be used for various image capturing apparatuses represented by a digital camera, a digital video camera, and the like.

As shown in FIG. 1, in the image sensor according to the first embodiment, a plurality of pixels 101 are two-dimensionally arranged. Note that FIG. 1 shows six pixels in each of the horizontal direction (row direction) and the vertical direction (column direction) for the sake of descriptive convenience. However, several millions to several tens of millions of pixels 101 are arranged in an actual image sensor. The detailed arrangement of the pixel 101 will be described with reference to FIG. 2.

Figure 2:
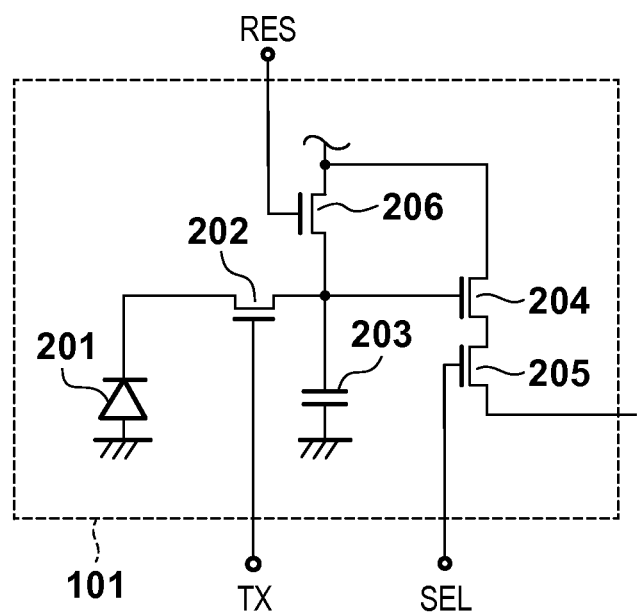
FIG. 2 is a circuit diagram showing an example of an arrangement of a pixel of the image sensor.

As shown in FIG. 2, the pixel 101 includes a photodiode 201, a transfer switch 202, a floating diffusion unit 203, a MOS amplifier 204, a selection switch 205, and a reset switch 206.

The photodiode 201 converts, into an electrical signal, light that enters via the optical system of the image capturing apparatus. The photodiode 201 is connected to the transfer switch 202. The gate of the transfer switch 202 is controlled by a control signal TX to transfer charges accumulated in the photodiode 201 to the floating diffusion unit 203.

The floating diffusion unit 203 converts the charges into a voltage corresponding to the transferred charge amount, and inputs the voltage to the gate of the MOS amplifier 204. The output of the MOS amplifier 204 is input to the selection switch 205. When a control signal SEL of the selection switch 205 selects a corresponding row, a pixel signal on the corresponding row appears in a vertical output line (column output line) on each column.

The reset switch 206 is controlled by a control signal RES. The charges accumulated in the floating diffusion unit 203 can be reset via the reset switch 206.

Referring back to FIG. 1, each of vertical output lines (column output lines) 102a and 102b outputs pixel signals output from the pixels 101 arranged on the corresponding column of the image sensor. Each of constant-current sources 103a and 103b drives the corresponding one of the vertical output lines 102a and 102b. As shown in FIG. 1, the vertical output lines 102a and 102b according to the first embodiment are two divided lines in the vertical direction of the image sensor. The constant-current sources 103a and 103b are arranged in correspondence with the vertical output lines 102a and 102b, respectively.

The floating diffusion units 203 and MOS amplifiers 204 of the pixels 101, the vertical output line 102a or 102b, and the constant-current source 103a or 103b constitute a source follower. The charges of the respective pixels 101 arranged on rows selected by the selection switches 205 are converted into voltage signals, and the voltage signals appear in the vertical output lines 102a and 102b, respectively.

The control signals SEL, RES, and TX for controlling the pixels 101 are supplied from vertical scanning circuits 104a and 104b and signal selection circuits 105a and 105b. A common vertical scanning pulse input to the vertical scanning circuits 104a and 104b decides rows to be selected. Pieces of information of the selected rows are transferred to the signal selection circuits 105a and 105b, respectively.

Each of the signal selection circuits 105a and 105b supplies the control signals to the pixels on the corresponding row, as needed, in accordance with the timings of the input signals SEL, RES, and TX supplied from a timing generator (not shown) and the information of the selected row. In this way, the pixel signals on the selected rows appear in the vertical output lines 102a and 102b, respectively.

In the first embodiment, outputs on two rows selected by the two vertical scanning circuits 104a and 104b appear in the vertical output lines 102a and 102b, respectively. The pixel signals thus appearing in the vertical output lines 102a and 102b are input to column circuits 106a and 106b.

Each of the column circuits 106a and 106b is formed by a circuit including a column amplifier. The same gain selected by a control signal (not shown) is multiplied in the amplifiers in all the upper and lower column circuits.

A vertical output line generally extends from the first pixel to the last pixel in the vertical direction in the image sensor. Especially in an image sensor for a single-lens reflex camera whose actual size is large, the influence of electrical resistance, distributed capacitance, and the like due to the physical length of the vertical output line destabilizes the circuits. For example, it takes time until the signal potential of the vertical output line becomes stable after a selection switch in each pixel is turned on. Consequently, after turning on the selection switch, it is impossible to immediately read out a column amplifier output in a column circuit.

To the contrary, it is possible to significantly reduce the factor of instability by dividing the vertical output line (column output line) in the vertical direction (column direction), providing the column circuits 106a and 106b for the respective vertical output lines, and performing signal processing, as shown in FIG. 1. This can largely shorten the stability latency time, thereby shortening the readout time. In addition, it is possible to simultaneously read out pixel signals on two different rows in the vertical direction, thereby almost halving the readout time.

The signals amplified by an appropriate gain in the column circuits 106a and 106b are input to A/D conversion circuits 107a and 107b on each column, respectively. The A/D conversion circuits 107a and 107b convert the output signals of the column circuits 106a and 106b within a predetermined range, and output digital signals, respectively. The output signals of the A/D conversion circuits 107a and 107b are temporarily held in memories 108a and 108b of the succeeding stage, respectively. When the output signals are held in the memories 108a and 108b, the A/D conversion circuits 107a and 107b can immediately start an A/D conversion operation for the next rows, thereby allowing a high-speed operation.

The digital data held in the memories 108a and 108b are sequentially output for each column by horizontal output circuits 109a and 109b, and output outside the image sensor by final output drivers 110a and 110b. Although each of the final output drivers 110a and 110b is simply shown in FIG. 1, it can actually formed by, for example, a circuit for sorting parallel data, a serialization circuit, an LVDS driver, and the like so as to appropriately output the digital data.

Note that in the first embodiment, a dotted-line portion including a pixel area in which the pixels 101 are two-dimensionally arranged, the vertical scanning circuits 104a and 104b, and the signal selection circuits 105a and 105b is formed in a first semiconductor 111.

The components except for the above ones, that is, the constant-current sources 103a and 103b, the column circuits 106a and 106b, the A/D conversion circuits 107a and 107b, the memories 108a and 108b, the horizontal output circuits 109a and 109b, and the final output drivers 110a and 110b are formed in a second semiconductor 112.

The first semiconductor 111 and the second semiconductor 112 are stacked, and connected at connection points 113 provided between these semiconductors.

Figure 3A:
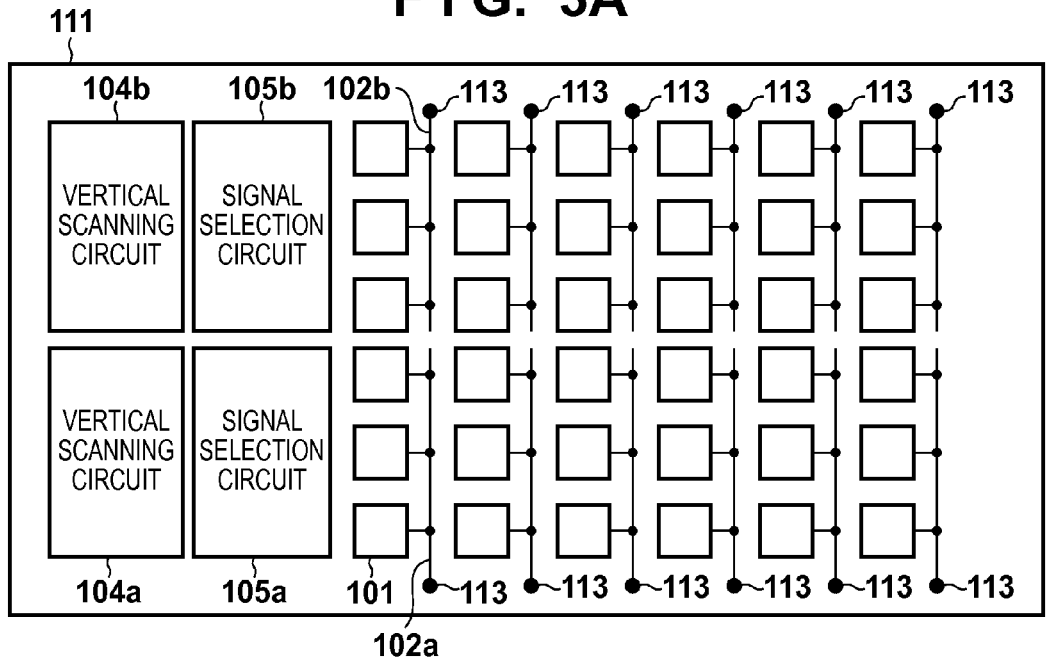
FIGS. 3A and 3B are views each showing a schematic arrangement in a semiconductor of the image sensor according to the first embodiment.

Examples of the arrangements of the respective components in the above-described first semiconductor 111 and second semiconductor 112 will be described with reference to FIGS. 3A and 3B. FIG. 3A is an overlooking view showing the image sensor according to the first embodiment, when viewed from the side of the first semiconductor 111 in which the pixel area is arranged.

The first semiconductor 111 and the second semiconductor 112 are semiconductor chips that are formed on different semiconductor substrates and have almost the same external form, and are stacked and connected by electronic wirings. The semiconductors are encapsulated in a single package, and dealt as one image sensor.

Referring to FIG. 3A, the vertical scanning circuits 104a and 104b, the signal selection circuits 105a and 105b, the pixel area in which the pixels 101 are two-dimensionally arranged, and the divided vertical output lines 102a and 102b in the vertical direction on each column are arranged in the first semiconductor 111. The connection points 113 for electrically connecting to the second semiconductor are arranged in end portions of the vertical output lines 102a and 102b.

Figure 3B:
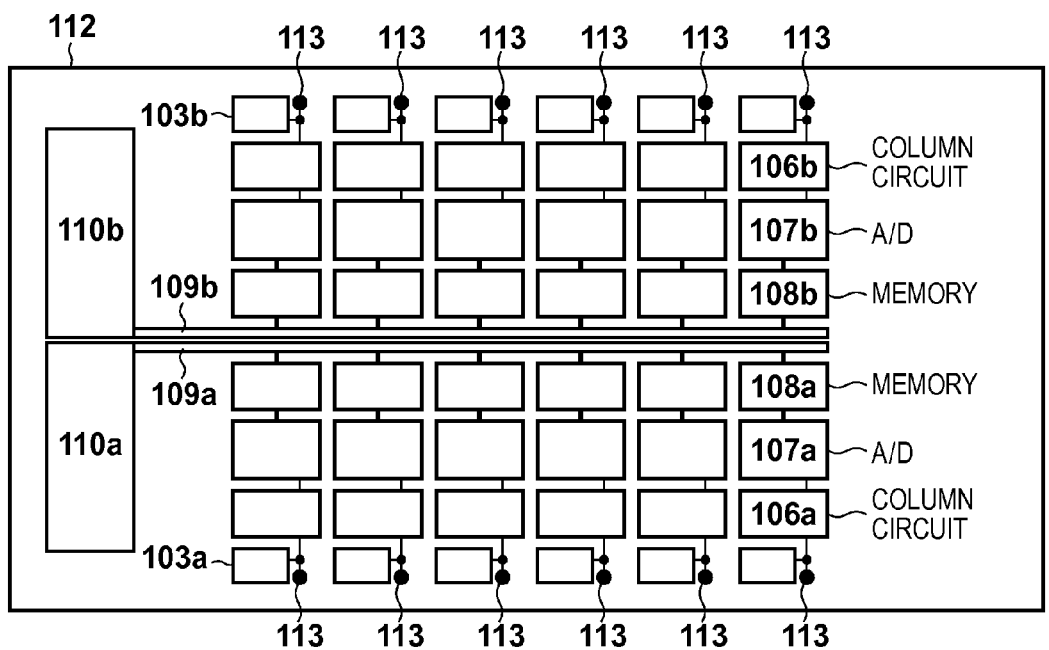

FIG. 3B is an overlooking view showing the image sensor according to the first embodiment. FIG. 3B shows the second semiconductor 112 in which the peripheral circuit units are arranged and which can been seen when the first semiconductor 111 is removed. In the second semiconductor 112 as well, the connection points 113 are arranged at the same positions as those in the first semiconductor 111. The constant-current sources 103a and 103b of the vertical output lines are arranged near the connection points 113. Immediately after the constant-current sources 103a and 103b, the column circuits 106a and 106b are arranged. The A/D conversion circuits 107a and 107b are arranged at the succeeding stage. The A/D conversion circuits 107a and 107b occupy the largest region with respect to the circuit scale. The memories 108a and 108b are arranged at the succeeding stage. The above-described components are arranged in the same direction as the pixel column direction.

The horizontal output circuits 109a and 109b are laid out in the horizontal direction (row direction) at the center of the second semiconductor 112. Digital signal outputs are transferred to the horizontal output circuits 109a and 109b, and then supplied to the final output drivers 110a and 110b at the left end. The area of each of the final output drivers 110a and 110b depends on the output scheme but tends to become large since the logic circuit scale is relatively large and a circuit that executes driving by a relatively high current, in the image sensor, for driving for final output such as LVDS is included.

Figure 4:
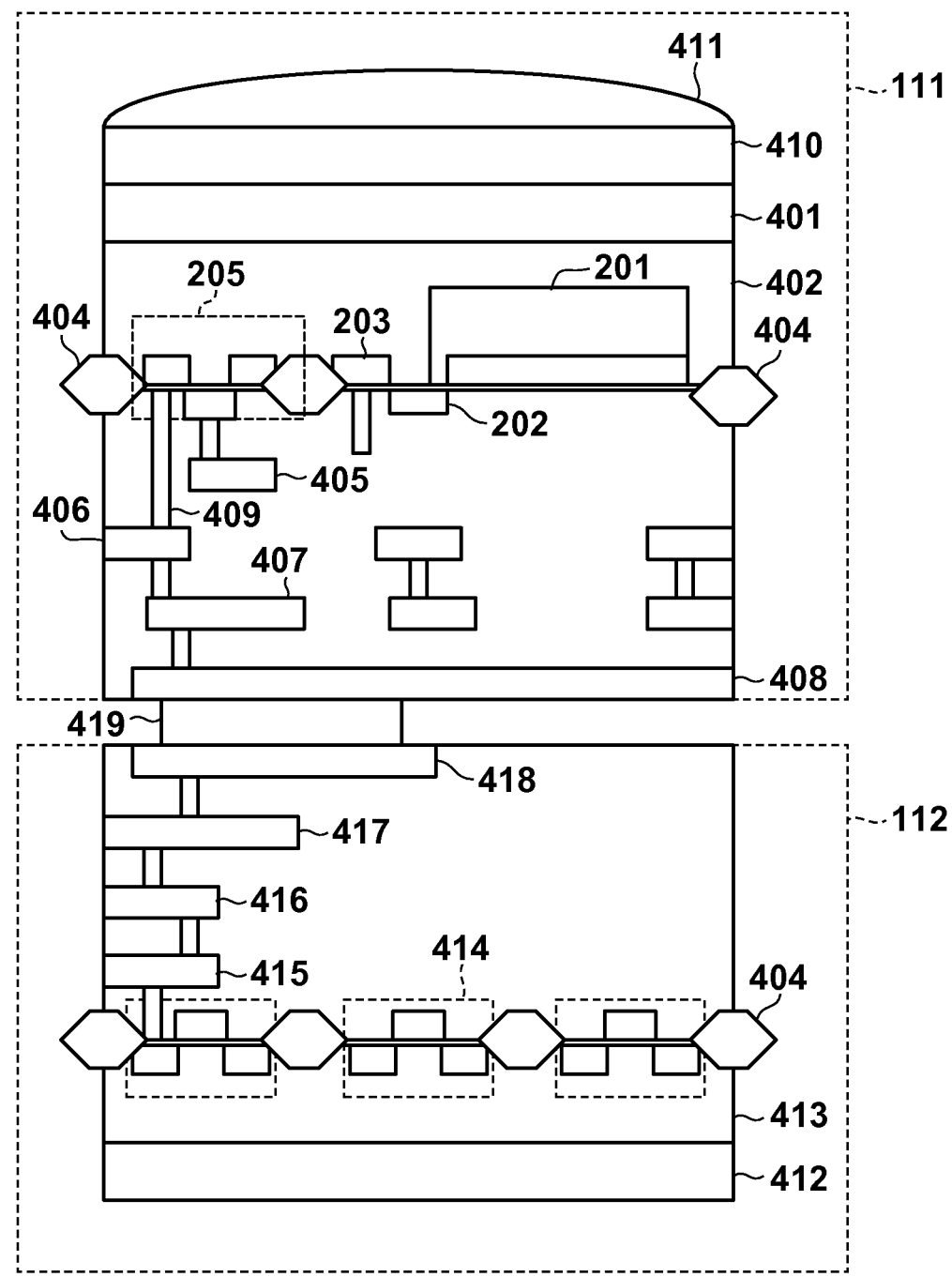
FIG. 4 is a view showing an example of a sectional structure of the image sensor according to the embodiment.

FIG. 4 shows the sectional structure of the image sensor according to the first embodiment of the present invention. The first semiconductor 111 in which the pixels are arranged is formed on a semiconductor substrate 401, and includes a region 402 of a first conductivity type. In the region 402 of the first conductivity type, the region 201 of a second conductivity type constituting the photodiode, the transfer switch 202, the floating diffusion unit 203, and selection switch 205 are provided. Note that the reset switch and MOS amplifier are not shown for the sake of simplicity.

Element isolation regions 404, a first wiring layer 405, a second wiring layer 406, a third wiring layer 407, and a fourth wiring layer 408 are provided. The fourth wiring layer 408 constitutes the connection points 113. The respective wiring layers are electrically connected by through holes 409.

As an arrangement unique to the pixel area, a color filter layer 410 and a microlens 411 are formed in each pixel.

On the other hand, the second semiconductor 112 is formed on a semiconductor substrate 412, and includes a region 413 of the first conductivity type. In the region 413 of the first conductivity type, transistors 414 are formed. The element isolation regions 404, a first wiring layer 415, a second wiring layer 416, a third wiring layer 417, and a fourth wiring layer 418 are provided. The fourth wiring layer 418 constitutes the connection points 113. The connection points 113 of the first semiconductor 111 and those of the second semiconductor 112 are connected by a microbump 419 or the like. At present, the pixel pitch of the image sensor is on the order of several microns. If, however, it is possible to shift the positions of the connection points for each column, the microbump pitch which is twice as large as the pixel pitch can be ensured, and thus the microbump can be used.

As another connection method, after the semiconductors are laminated, a through hole is formed in one of the semiconductor substrates to the wireling layer of the other semiconductor, and metal is embedded in the through hole to form a through VIA, thereby ensuring electrical connection.

The edge pixel has been explained with reference to FIG. 4. Various functional block circuits are formed under the pixel area around the central portion, as shown in FIG. 3B.

Dividing the virtual output line in the vertical direction (column direction) allows a high-speed readout operation. Also, arranging column circuits, A/D conversion circuits, and the like of the corresponding pixel columns on the back surface of the pixel area can minimize the external dimension of the image sensor. This can encapsulate even a large image sensor in a small package, thereby contributing to downsizing of a camera. Note that it is possible to efficiently downsizing the image sensor by stacking the semiconductors so that the overlapping area becomes largest when connecting the first semiconductor 111 and the second semiconductor 112.

The number of wiring layers, the structure, and the like of each semiconductor are not limited to the scope described in the first embodiment, and the present invention is applicable to a semiconductor with an arbitrary number of layers.

In the first embodiment, the constant-current circuits for driving the respective vertical output lines are arranged in the second semiconductor 112. The constant-current circuits, however, may be arranged in the first semiconductor 111.

Second Embodiment

An image sensor according to the second embodiment of the present invention will be described below. In the second embodiment, an image sensor in which a vertical output line (column output line) is divided into four lines in the vertical direction (column direction), and the end portion of each line is set as a connection point to the second semiconductor will be explained.

Figure 5A:
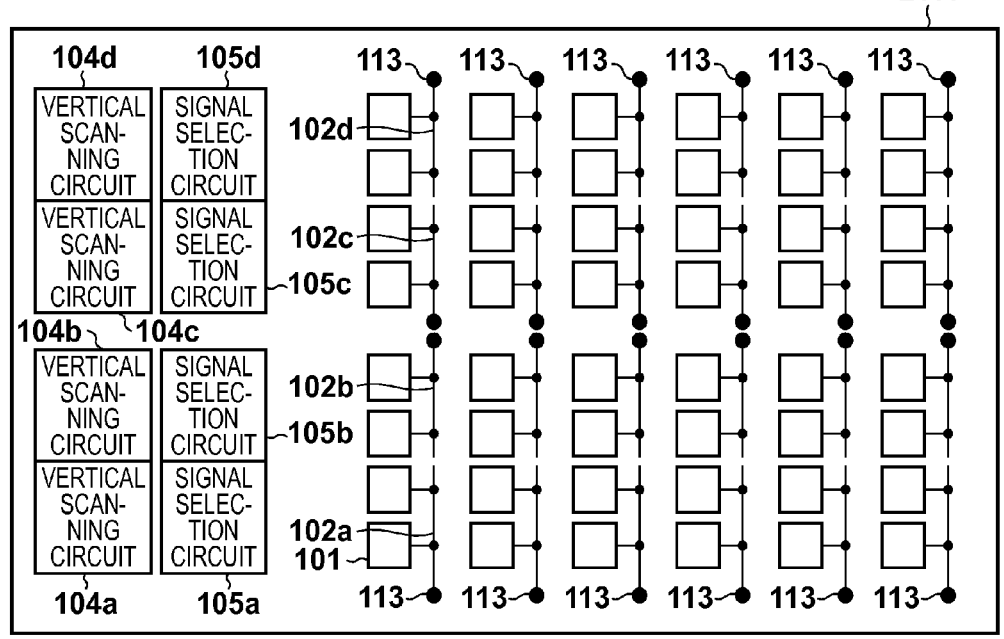
FIGS. 5A and 5B are views each showing a schematic arrangement in a semiconductor of an image sensor according to a second embodiment.

FIG. 5A is an overlooking view when viewed from the side of a first semiconductor 2111 in which the pixel area of the image sensor is arranged according to the second embodiment. Referring to FIG. 5A, vertical scanning circuits 104a to 104d, signal selection circuits 105a to 105d, a pixel area in which pixels 101 are two-dimensionally arranged, and divided vertical output lines 102a to 102d in the vertical direction on each column are arranged on the first semiconductor 2111. A connection point 113 for electrically connecting to a second semiconductor 2112 is arranged in the end portion of each of the vertical output lines 102a to 102d. Note that the arrangement of each pixel 101 is the same as that described with reference to FIG. 2 and a description thereof will be omitted.

Figure 5B:
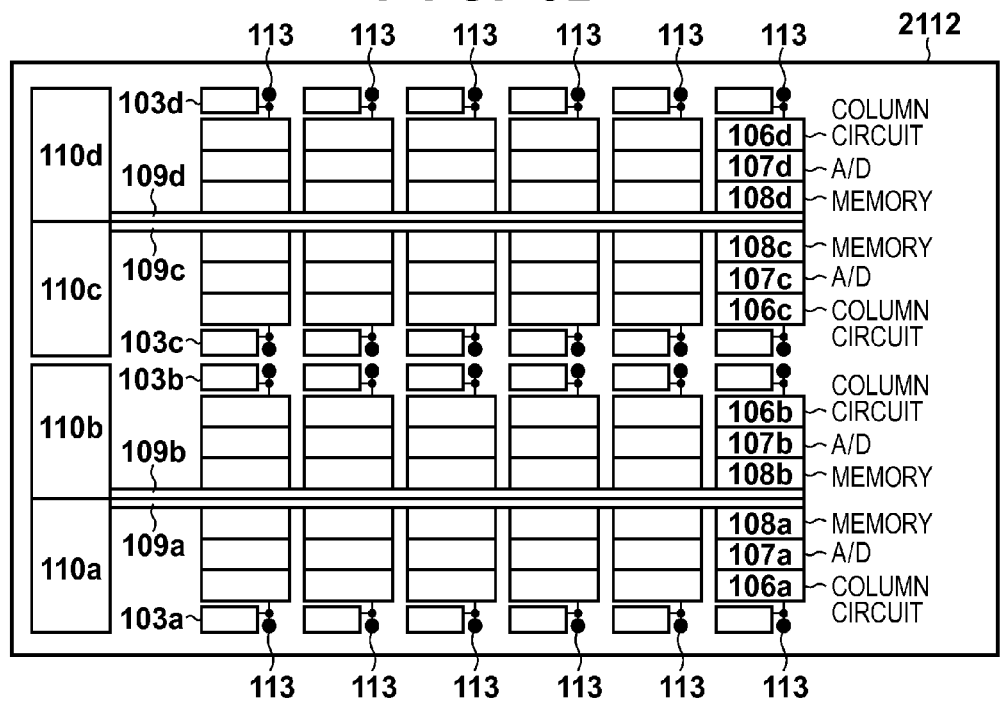

FIG. 5B is an overlooking view showing the image sensor according to the second embodiment. FIG. 5B shows the second semiconductor 2112 in which peripheral circuit units are arranged and which can be seen when the first semiconductor 2111 is removed. In the second semiconductor 2112 as well, connection points 113 are arranged at the same positions as those in the first semiconductor 2111. Constant-current sources 103a to 103d of the vertical output lines are arranged near the connection points 113. Immediately after the constant-current sources 103a to 103d, column circuits 106a to 106d are arranged. A/D conversion circuits 107a to 107d are arranged at the succeeding stage. The arrangement of the second embodiment can be implemented when the circuit scale can be designed to be smaller than that in the first embodiment, and four sets of circuits can be arranged on each column in the vertical direction (column direction) of the image sensor. Memories 108a to 108d are arranged at the succeeding stage. The above-described components are arranged in the same direction as the pixel column direction.

Horizontal output circuits 109a to 109d are laid out in the horizontal direction at the centers of the upper and lower blocks of the second semiconductor 2112. Digital signal outputs are transferred to the horizontal output circuits 109a to 109d, and then supplied to final output drivers 110a to 110d at the left end. The area of each of the final output drivers 110a to 110d depends on the output scheme but tends to become large since the logic circuit scale is relatively large and a circuit that executes driving by a relatively high current in the image sensor for driving for final output such as LVDS is included.

Note that in the second embodiment, the constant-current sources 103a to 103d for driving the respective vertical output lines 102a to 102d are arranged in the second semiconductor 2112. This is because it is difficult to arrange the constant-current sources in the first semiconductor 2111 if the vertical line is divided into three or more lines in the vertical direction, and thus it is more desirable to arrange the constant-current sources in the second semiconductor 2112.

As described above, it is possible to read out four rows at the same time by increasing the number of divided vertical output lines (column output lines) in the vertical direction (column direction), thereby allowing a higher-speed readout operation. Also, arranging column circuits, A/D conversion circuits, and the like of the corresponding pixel columns on the back surface of the pixel area can minimize the external dimension of the image sensor. This can encapsulate even a large image sensor in a small package, thereby contributing to downsizing of a camera.

Furthermore, since it is possible to determine the vertical division number based on the circuit area that can be actually arranged in the second semiconductor in the column direction, it is possible to determine an arbitrary division number, and appropriately design the image sensor so that the external dimension of the image sensor becomes smallest or appropriately design the image sensor suitable for image processing of the succeeding stage.

In the above-described first or second embodiment, a case in which the first semiconductor 111 or 2111 and the second semiconductor 112 or 2112 that are stacked are connected using the microbump on the wiring layer side has been explained. The present invention is not limited to this. The connection form of the respective semiconductors is different depending on whether the pixel area is of the back illumination type or front illumination type, or whether the semiconductors are connected by the microbump or through VIA. Any arrangement may be adopted.

Third Embodiment

Figure 6:
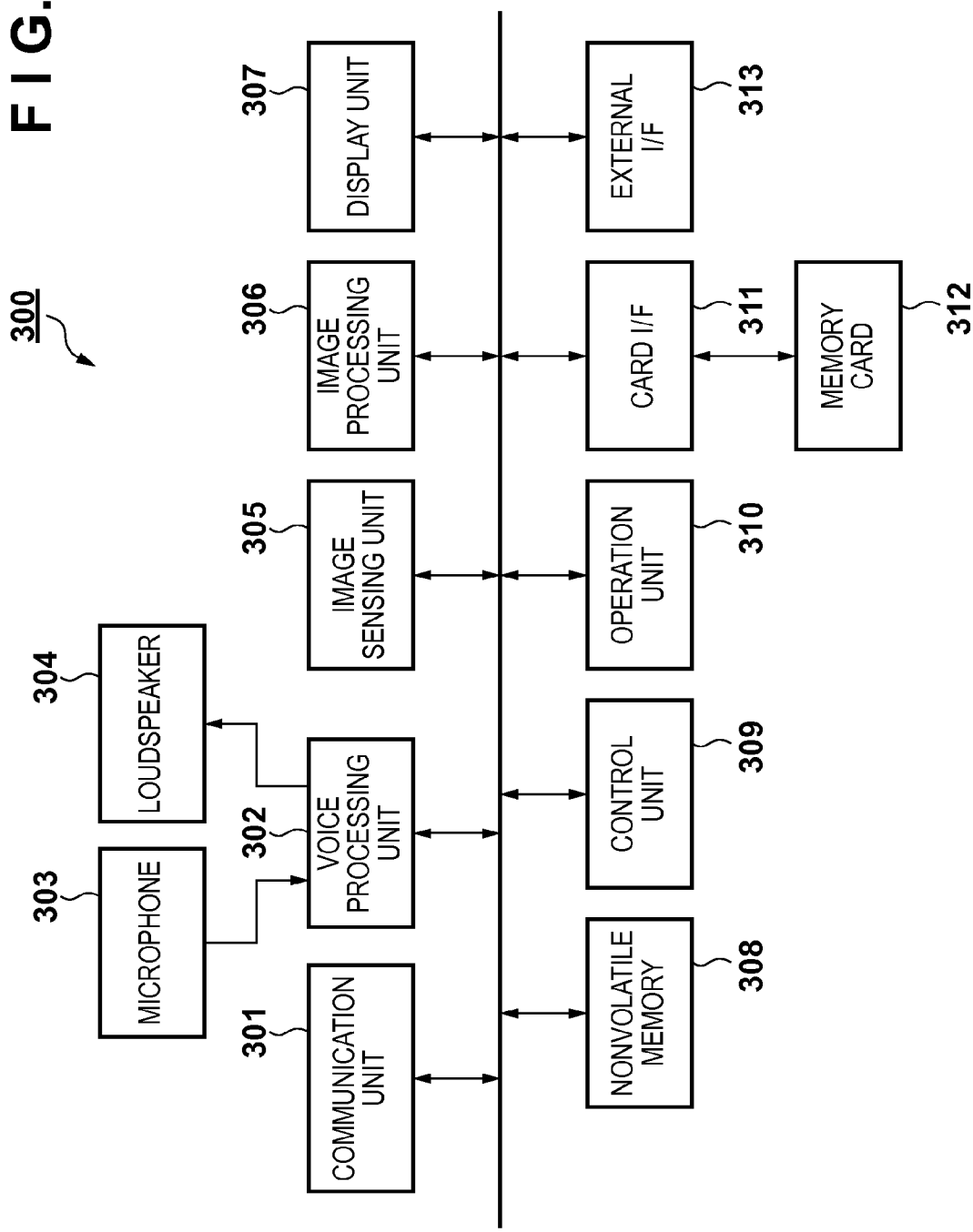
FIG. 6 is a block diagram showing the schematic arrangement of a cellular phone according to a third embodiment.

FIG. 6 is a block diagram showing an arrangement of a cellular phone 300 according to the third embodiment of the present invention. The cellular phone 300 according to the third embodiment has the e-mail function, Internet connection function, image shooting/playback function, and the like, in addition to the voice communication function.

In FIG. 6, a communication unit 301 communicates voice data and image data with another phone by a communication method complying with a communication carrier with which the user has a contract. In voice communication, a voice processing unit 302 converts voice data from a microphone 303 into a format suited for origination, and sends the converted data to the communication unit 301. Also, the voice processing unit 302 decodes voice data from a call destination that has been sent from the communication unit 301, and sends the decoded data to a loudspeaker 304.

An image sensing unit 305 includes the image sensor described in one of the first and second embodiments, shoots an image of an object, and outputs image data. At the time of shooting an image, an image processing unit 306 processes image data shot by the image sensing unit 305, converts the data into a format suited for recording, and outputs the converted data. At the time of playing back a recorded image, the image processing unit 306 processes the image to be played back, and sends the processed image to a display unit 307. The display unit 307 includes a liquid crystal display panel about several inches in size, and displays various display contents in accordance with instructions from a control unit 309. A nonvolatile memory 308 stores information of an address book, and data such as data of e-mail and image data shot by the image sensing unit 305.

The control unit 309 includes a CPU and memory, and controls the respective units of the cellular phone 300 in accordance with a control program stored in the memory (not shown). An operation unit 310 includes a power button, number keys, and various other operation keys used to input data by the user. A card I/F 311 records and reads out various data on and from a memory card 312. An external I/F 313 transmits, to an external device, data stored in the nonvolatile memory 308 and memory card 312, and receives data transmitted from an external device. The external I/F 313 performs communication by a well-known communication method such as wireless communication or a wired communication method conforming to, for example, a USB standard.

Next, the voice communication function in the cellular phone 300 will be explained. When calling a call destination, the user operates the number keys of the operation unit 310 to input the number of the call destination, or operates to display, on the display unit 307, an address book stored in the nonvolatile memory 308, selects the call destination, and instructs origination. When the origination is instructed, the control unit 309 originates a call to the call destination via the communication unit 301. If the call destination answers the call, the communication unit 301 outputs voice data of the destination to the voice processing unit 302, and also transmits voice data of the user to the destination.

When transmitting an e-mail, the user instructs creation of a mail by using the operation unit 310. When the creation of a mail is instructed, the control unit 309 displays a mail creation screen on the display unit 307. The user inputs a transmission destination address and body by using the operation unit 310, and instructs transmission. When transmission of the mail is instructed, the control unit 309 sends address information and data of the mail body to the communication unit 301. The communication unit 301 converts the mail data into a format suited for communication, and sends the converted data to the transmission destination. When the communication unit 301 receives an e-mail, it converts the received mail data into a format suited for display, and displays the converted data on the display unit 307.

Next, the image shooting function in the cellular phone 300 will be explained. When the user operates the operation unit 310 to set the shooting mode and then instructs shooting of a still image or moving image, the image sensing unit 305 performs shooting and sends the shot still image data or moving image data to the image processing unit 306. The image processing unit 306 processes the shot still image data or moving image data, and stores the processed data in the nonvolatile memory 308. The image processing unit 306 sends the obtained still image data or moving image data to the card I/F 311. The card I/F 311 stores the still image data or moving image data in the memory card 312.

The cellular phone 300 can transmit, as a file attached to an e-mail, a file including still image data or moving image data shot in this manner. More specifically, when transmitting an e-mail, an image file stored in the nonvolatile memory 308 or memory card 312 is selected, and transmission of the image file as an attached file is instructed.

The cellular phone 300 can also transmit a file including shot still image data or moving image data to an external device such as a PC or another phone via the external I/F 313. The user selects an image file stored in the nonvolatile memory 308 or memory card 312 and instructs transmission, by operating the operation unit 310. The control unit 309 controls to read out the selected image file from the nonvolatile memory 308 or memory card 312, and controls the external I/F 313 to transmit the readout image file to the external device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-243346, filed on Nov. 25, 2013 and No. 2014-217663, filed on Oct. 24, 2014, which are hereby incorporated by reference herein in their entirety.

What is claimed is:

1. An image sensor comprising:
a first semiconductor substrate including a plurality of pixels two-dimensionally arranged, and a plurality of output lines to which pixel signals are output from the plurality of pixels; and
a second semiconductor substrate including a plurality of signal processing units, corresponding to the plurality of output lines, respectively, which process the output pixel signals, and a plurality of output units, each shared by the plurality of the signal processing units, which output the processed signals outside of the image sensor,
wherein the first semiconductor substrate and the second semiconductor substrate are stacked, N (N is a positive integer greater than 1) output lines are arranged in each column of the plurality of pixels, and the plurality of output lines and the plurality of signal processing units are connected in correspondence with each other,
each of the plurality of signal processing unit includes at least two processing parts connected in series between the corresponding output line and one of the output units, and
N is determined to correspond to a number of the signal processing units arranged in each column on the second semiconductor.

2. The sensor according to claim 1, wherein the first semiconductor substrate and the second semiconductor substrate are stacked so that an overlapping area becomes largest.

3. The sensor according to claim 1, wherein the first semiconductor substrate and the second semiconductor substrate have the same external form.

4. The sensor according to claim 1, wherein each of the plurality of signal processing units includes at least one of an amplifier, an A/D conversion circuit, an a memory.

5. The sensor according to claim 1, wherein the second semiconductor substrate further includes a plurality of driving units which drive each of the plurality of output lines, respectively.

6. An image capturing apparatus comprising:
an image sensor, wherein the image sensor further comprises:
a first semiconductor substrate including a plurality of pixels two-dimensionally arranged, and a plurality of output lines to which pixel signals are output from the plurality of pixels; and
a second semiconductor substrate including a plurality of signal processing unit corresponding to the plurality of output lines, respectively, which process the output pixel signals, and a plurality of output units, each shared by the plurality of signal processing units, which output the processed signals outside of the image sensor,
wherein the first semiconductor substrate and the second semiconductor substrate are stacked, N (N is a positive integer greater than 1) output lines are arranged in each column of the plurality of pixels, and the plurality of output lines and the plurality of signal processing units are connected in correspondence with each other,
each of the plurality of signal processing units includes at least two processing parts connected in series between the corresponding output line and one of the output units, and
N is determined to correspond to a number of the signal processing units arranged in each column on the second semiconductor.

7. A cellular phone comprising:
an image sensor, wherein the image sensor further comprises:
a first semiconductor substrate including a plurality of pixels two-dimensionally arranged, and a plurality of output lines to which pixel signals are output from the plurality of pixels; and a second semiconductor substrate including a plurality of signal processing units, corresponding to the plurality of output lines, respectively, which process the output pixel signals, and a plurality of output units, each shared by the plurality of signal processing units, which output the processed signals outside of the image sensor, wherein the first semiconductor substrate and the second semiconductor substrate are stacked, N (N is a positive integer greater than 1) output lines are arranged in each column of the plurality of pixels, and the plurality of output lines and the plurality of signal processing units are connected in correspondence with each other, each of the plurality of signal processing units includes at least two processing parts connected in series between the corresponding output line and one of the output units, and N is determined to correspond to a number of the signal processing units arranged in each column on the second semiconductor.

8. The sensor according to claim 1, wherein N groups of successive pixels arrayed in each column are connected to each of the N output lines, respectively.

9. The sensor according to claim 1, wherein N is determined so that the signal processing units fit within the second semiconductor.

10. The apparatus according to claim 6, wherein N is determined so that the signal processing units fit within the second semiconductor.

11. The cellular phone according to claim 7, wherein N is determined so that the signal processing units fit within the second semiconductor.

12. The sensor according to claim 8, wherein the first semiconductor substrate further includes N scanning circuits which controls the N groups of successive pixels, respectively.

13. The apparatus according to claim 6, wherein N groups of successive pixels arrayed in each column are connected to each of the N output lines, respectively.

14. The apparatus according to claim 13, wherein the first semiconductor substrate further includes N scanning circuits which controls the N groups successive pixels, respectively.

15. The cellular phone according to claim 7, wherein N groups of successive pixels arrayed in each column are connected to each of the N output lines, respectively.

16. The cellular phone, according to claim 15, wherein the first semiconductor substrate further includes N scanning circuits which controls the N groups of successive pixels, respectively.

* * * * *